(12) United States Patent
See et al.

(10) Patent No.: US 6,764,914 B2
(45) Date of Patent: Jul. 20, 2004

(54) METHOD OF FORMING A HIGH K METALLIC DIELECTRIC LAYER

(75) Inventors: Alex See, Singapore (SG); Cher Liang Randall Cha, Singapore (SG); Shyue Fong Quek, Petaling Jaya (MY); Ting Cheong Ang, Singapore (SG); Wye Boon Loh, Johor Bahru (MY); Sang Yee Loong, Singapore (SG); Jun Song, Singapore (SG); Chua Chee Tee, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/290,130

(22) Filed: Nov. 7, 2002

(65) Prior Publication Data

US 2003/0104673 A1 Jun. 5, 2003

Related U.S. Application Data

(62) Division of application No. 09/609,447, filed on Jul. 3, 2000, now Pat. No. 6,492,242.

(51) Int. Cl.$^7$ ...................... H01L 21/20; H01L 21/8234
(52) U.S. Cl. ........................ 438/393; 438/240
(58) Field of Search ................................. 438/393, 238, 438/239, 240, 381, 386, 785

(56) References Cited

U.S. PATENT DOCUMENTS

| | | | | |
|---|---|---|---|---|
| 4,460,938 A | * | 7/1984 | Clei ........................... 361/411 |
| 5,415,901 A | * | 5/1995 | Tanaka et al. .............. 427/596 |
| 5,494,840 A | * | 2/1996 | Ohmi .......................... 438/240 |
| 5,834,357 A | | 11/1998 | Kang .......................... 438/396 |
| 5,850,089 A | | 12/1998 | Varshney et al. ............ 257/295 |
| 5,858,853 A | | 1/1999 | Shishiguchi et al. ........ 438/398 |
| 5,869,859 A | | 2/1999 | Hanagasaki .................. 257/296 |
| 5,876,788 A | | 3/1999 | Bronner et al. ............... 427/81 |
| 5,930,584 A | | 7/1999 | Sun et al. ........................ 438/3 |
| 5,939,131 A | | 8/1999 | Kim et al. ..................... 427/81 |
| 5,943,580 A | | 8/1999 | Ramakrishnan ............. 438/381 |
| 5,963,826 A | * | 10/1999 | Takanabe et al. ........... 438/622 |
| 6,010,744 A | * | 1/2000 | Buskirk et al. ............... 427/81 |
| 6,018,175 A | * | 1/2000 | Kao et al. .................... 257/300 |

FOREIGN PATENT DOCUMENTS

JP     01-154547 A   *   6/1989

\* cited by examiner

*Primary Examiner*—Michael Trinh
(74) *Attorney, Agent, or Firm*—George O. Saile; Rosemary L. S. Pike

(57) ABSTRACT

A process for forming a high dielectric constant, (High K), layer, for a metal-oxide-metal, capacitor structure, featuring localized oxidation of an underlying metal layer, performed at a temperature higher than the temperature experienced by surrounding structures, has been developed. A first iteration of this process features the use of a laser ablation procedure, performed to a local region of an underlying metal layer, in an oxidizing ambient. The laser ablation procedure creates the desired, high temperature, only at the laser spot, allowing a high K layer to be created at this temperature, while the surrounding structures on a semiconductor substrate, not directly exposed to the laser ablation procedure remain at lower temperatures. A second iteration features the exposure of specific regions of an underlying metal layer, to a UV, or to an I line exposure procedure, performed in an oxidizing ambient, with the regions of an underlying metal layer exposed to the UV or I line procedure, via clear regions in an overlying photolithographic plate. This procedure also results in the formation of a high K layer, on a top portion of the underlying metal layer.

8 Claims, 3 Drawing Sheets

METHOD OF FORMING A HIGH K METALLIC DIELECTRIC LAYER

This is a division of patent application Ser. No. 09/609,447, filing date Jul. 3, 2000, now issued as U.S. Pat. No. 6,492,242 B1, "Method Of Forming A High k Metallic Dielectric Layer", assigned to the same assignee as the present invention.

BACKGROUND OF THE INVENTION (1) Field of the Invention

The present invention relates to methods used to fabricate metal-insulator-metal capacitor structures for semiconductor integrated circuits, and more specifically to a method used to form a high dielectric constant, (high k), metallic oxide layer, for use as a dielectric layer for a capacitor structure.

(2) Description of Prior Art

Metal-Oxide-Metal, (MOM), capacitor structures are commonly used in current analog/RF circuits. The use of an insulator layer, with a high dielectric constant, (high K), would be useful in terms of providing efficient charging for the analog devices. Therefore capacitor dielectric layers, such as silicon nitride, with a dielectric constant of about 7, has been used in place of silicon oxide dielectric layers, featuring a dielectric constant of only about 3.9. For enhanced capacitor performance, metal oxide layers, with dielectric constants even larger than silicon nitride values, are now being considered for use in MOM structures. However to form reliable, (in terms of breakdown strength), metal oxide layers, such as tantalum pentoxide, $(Ta_2O_5)$, or aluminum oxide, $(Al_2O_3)$, temperatures greater than 400° C., are needed. These elevated temperatures however, can result in degradation to existing interconnect structures, comprised of aluminum based metallurgies. The exposure of these aluminum based structures, to temperatures needed to form the metal oxide layer, can result in pre-melting, or reflowing of these structures.

This invention will describe processes used to form reliable, dense, metal oxide layers, for MOM structures, still however avoiding the exposure of the surrounding interconnect structures, metal structures other than MOM structures, to elevated temperatures. A first iteration will describe local heating of an area of a metal layer, in an oxidizing environment, accomplished via local laser ablation. The laser ablation process results in only surface heating of an underlying metal layer, allowing the desired region of metal to be oxidized, forming the desired metal oxide layer at temperatures greater than temperatures experienced by surrounding metal structures. A second iteration will describe the localized formation of the metal oxide layer, in an oxidizing environment, using energy supplied by either UV or I line exposures. Conventional photolithographic plates are used to allow specific regions of an underlying metal layer to experience the UV or I line exposure. Prior art such as Kang in U.S. Pat. No. 5,834,357, as well as Sun et al, in U.S. Pat. No. 5,930,584, describe processes used to fabricate high K dielectric layers, however these prior arts do not feature the unique processes used in this invention to achieve metal oxide layers, without exposure of surrounding metal structures to the high oxidation temperatures, used to form reliable, dense metal oxide layers, on local regions of a metal layer.

SUMMARY OF THE INVENTION

It is an object of this invention to form a high K dielectric layer, for a metal-oxide-metal, (MOM), capacitor structure, via oxidation procedures, which allows the oxidizing region to experience a higher temperature than the surrounding metal interconnect structures.

It is another object of this invention to form a high K dielectric layer, via a laser ablation procedure, performed to localized regions of an underlying metal layer, in an oxidizing ambient.

It is still another object of this invention to form a high K dielectric layer via exposure of localized regions of an underlying metal layer, to UV or I line energies, in the presence of an oxidizing environment.

In accordance with the present invention a method of fabricating a metal-oxide-metal, (MOM), capacitor structure, featuring a high K dielectric layer, formed from localized heating of an underlying metal layer, is described. A first iteration of the invention initiates with the deposition of an underlying metal layer, for subsequent use as the bottom electrode for the MOM capacitor structure, followed by a laser ablation procedure, resulting in the formation of the desired high K, metal oxide component of the MOM capacitor structure. The laser ablation procedure, performed in an oxidizing environment, allows the laser ablated surface of the underlying metal layer to reach a temperature needed for formation of a dense, metal oxide region, while surrounding metal structures, or metal structures used for non-MOM purposes, do not experience the temperature increase. A second iteration of this invention features the subjection of localized regions of the underlying metal layer, to either UV or I line exposures. A photolithographic plate is used to allow only selective regions of the underlying metal layer to be subjected to the UV or I line exposures, performed in an oxidizing environment, thus resulting in the formation of the desired metal oxide component of the MOM capacitor structure, on an underlying metal electrode structure.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

Figure 1:
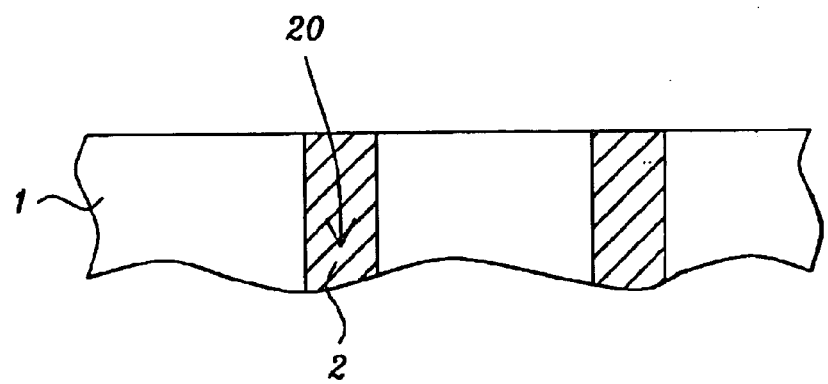
FIGS. 1–8, which schematically, in cross-sectional style, describe key stages of fabrication used to form a high K dielectric layer, for a MOM capacitor structure.
Figure 2:
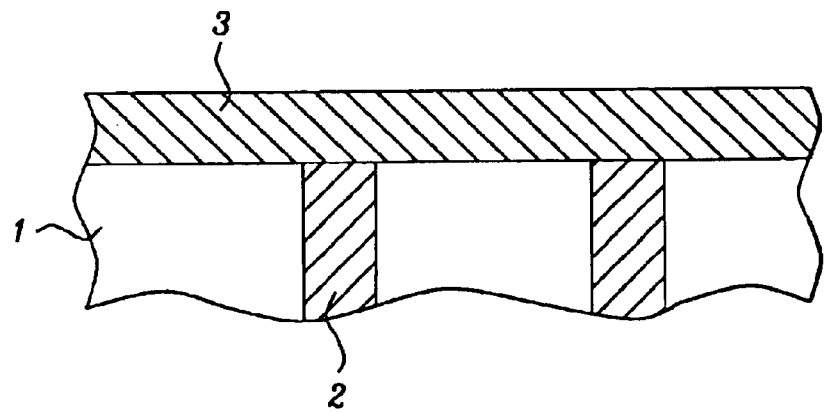

The methods used to form a high K dielectric layer for a metal-oxide-metal, (MOM), capacitor structure, featuring the use of laser ablation, UV or I line exposure procedures, performed to an underlying metal electrode component of the MOM capacitor structure, in an oxidizing environment, will now be described in detail. An interlevel dielectric, (ILD), layer 1, comprised of either silicon oxide, undoped silica glass, (USG), fluorinated silica glass, (FSG), or borophosphosilicate glass, is shown schematically in FIG. 1. Metal plug structures 2, comprised of a metal chosen from a group containing tungsten, copper, or aluminum, are formed in via holes 20. Via holes 20, can expose underlying metal interconnect structures, or via holes 20, can be dummy openings, terminating at the top surface of an underlying insulator layer. A metal layer 3, comprised of either aluminum, tantalum, or copper, shown schematically in FIG. 2, is next deposited via plasma vapor deposition, (PVD), procedures, to a thickness between about 3000 to 5000 Angstroms.

Figure 3:
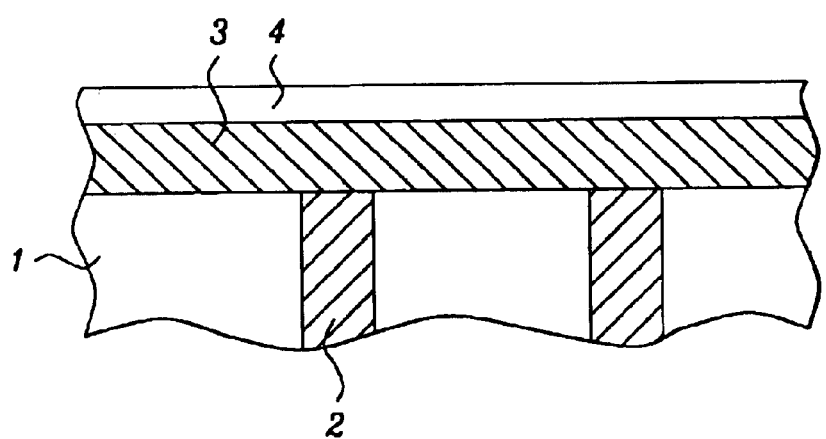
Figure 4:
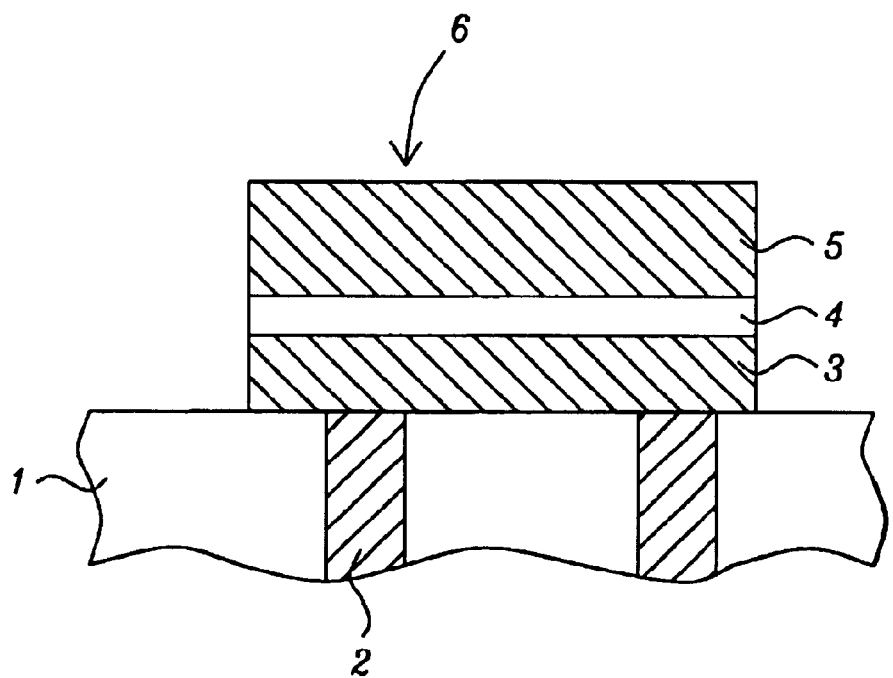

The first iteration of this invention is next detailed and described schematically in FIGS. 3–4. An in situ, laser procedure is performed to local regions of metal layer 3, in an environment comprised of either NO, $N_2O$, $O_2$, or $O_3$. The laser ablation procedure results in local heating of metal layer 3, confined to a region near the top surface of metal layer 3. The localized heating, created by the laser spot, results in melting of metal layer 3, confined at the top surface, and in the presence of an oxidizing ambient, forms metallic dielectric layer 4, consuming a portion of the of metal layer 3. The laser ablation procedure is performed using excimer or YAG laser, at a power between about 0.1 to 10 watts. The temperature reached, at the surface of metal layer 3, during the laser ablation procedure is between about 1000 to 2000° C., while the surrounding device regions are not influenced by the surface heating laser ablation procedure, and therefore remain at temperatures below 400° C. Metallic dielectric layer, or high K layer 4, is comprised of either $Ta_2O_5$, $Al_2O_3$, or $CuO_2$, at a thickness between about 200 to 400 Angstroms, and with a dielectric constant between about 22 to 35. The thickness of metal layer 3, after formation of high K layer 4, is now decreased to between about 2500 to 4500 Angstroms. This is schematically shown in FIG. 3. An overlying metal layer 5, again comprised of either aluminum, tantalum or copper, is next deposited via PVD procedures, to a thickness between about 3000 to 5000 Angstroms. This is schematically shown in FIG. 4. Conventional photolithographic and RIE procedures, using $Cl_2$ or $SF_6$, as an etchant for the metal layers, while either $BF_3$, or $CF_4/CHF_3$ is used as an etchant for the high K layer, are employed to define metal-oxide-metal, capacitor structure 6, schematically shown in FIG. 4.

Figure 5:
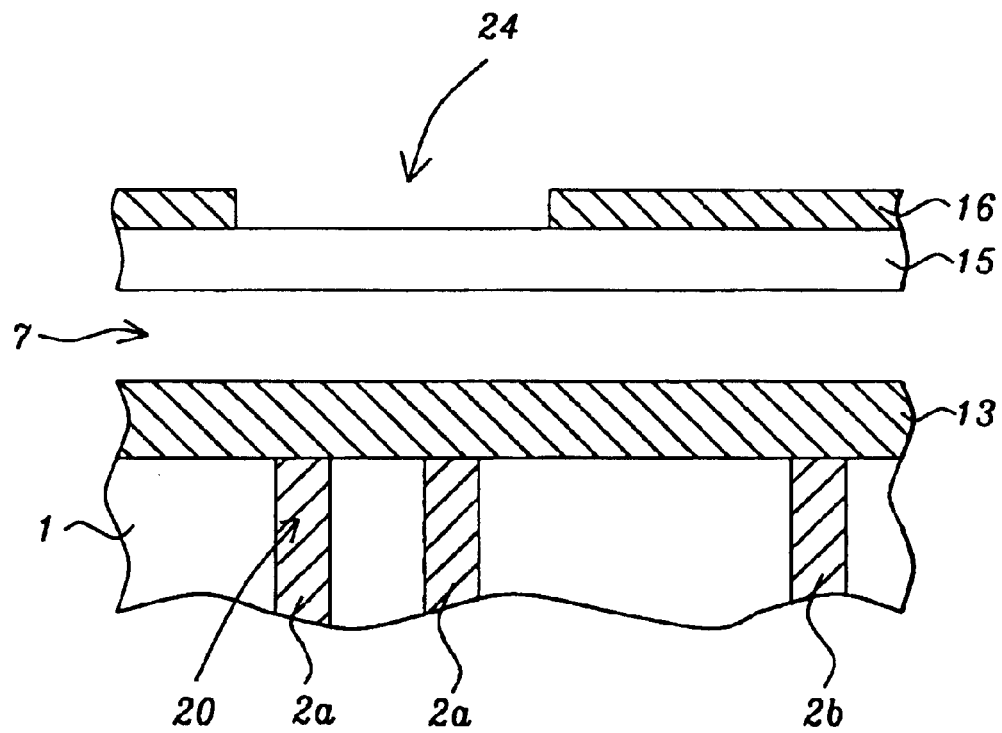

A second iteration of this invention, featuring formation of the desired high K layer, via use of UV or I line exposure, in an oxidizing ambient, is next addresses, and schematically described in FIGS. 5–8. FIG. 5, shows metal plug structures 2a, and metal plug structure 2b, in via holes 20, where via holes 20, were formed in interlevel dielectric layer 1. Metal layer 13, chosen from a group that includes titanium, tantalum, aluminum, or copper, is deposited via PVD procedures, to a thickness between about 2500 to 4500 Angstroms. A photolithographic plate 15, comprised of quartz, with a chromium pattern 16, is then situated, overlying metal layer 13. Opening 24, or the non-chromium, clear region of photolithographic plate 15, will subsequently define the region of metal layer 13, to be converted to the desired high K layer. This is schematically shown in FIG. 5.

Figure 6:
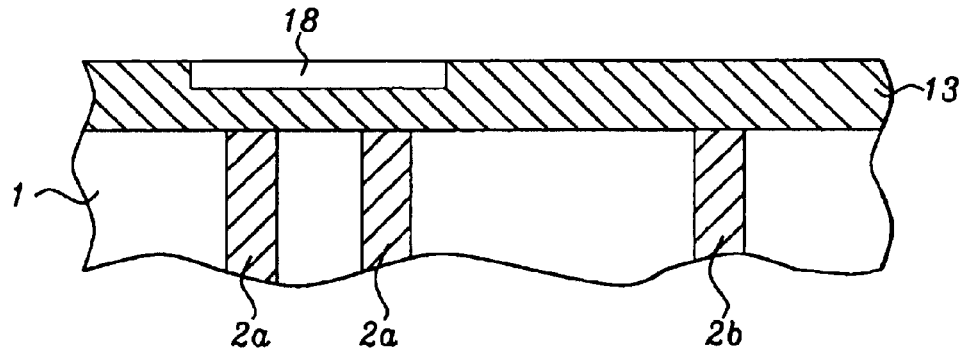

Exposure of metal layer 13, to a UV or to a I line, exposure conditions, in an ambient comprised of either $O_2$ or $O_3$, create high K layer 18, in regions of metal layer 13, directly underlying opening 24, in photolithographic plate 15. The oxygen or ozone, flowing in space 7, in combination with the energy supplied by the UV or I line exposure, are sufficient to oxidize a top portion of exposed metal layer 13. This is accomplished using a UV exposure at an energy between about 1 to 100 millijoules, while the exposure energy for the I line procedure is also between about 1 to 100 millijoules. The oxygen or ozone flow, in the space located between the photolithographic plate and the substrate, is maintained between about 10 to 1000 sccm. The temperature reached at the top surface of exposed metal layer 13, is between about 250 to 1000° C., forming high K layer 18, at a thickness between about 200 to 300 Angstroms, and reducing the thickness of the portion of metal layer 13, located underlying high K layer 18, to between about 2000 to 4000 Angstroms. The dielectric constant of high K layer 18, comprised of either $TiO_2$, $Al_2O_3$, $Ta_2O_5$, or $CuO_2$, is between about 22 to 35. The result of selectively forming high K layer 18, in only a portion of metal layer 13, is schematically shown in FIG. 6. Again, as was the case for the first iteration of this invention, the localized exposure of only a portion of the top surface of a metal layer, restricts the increase in temperature to only the exposed area, maintaining lower temperatures for the bulk of the device.

Figure 7:
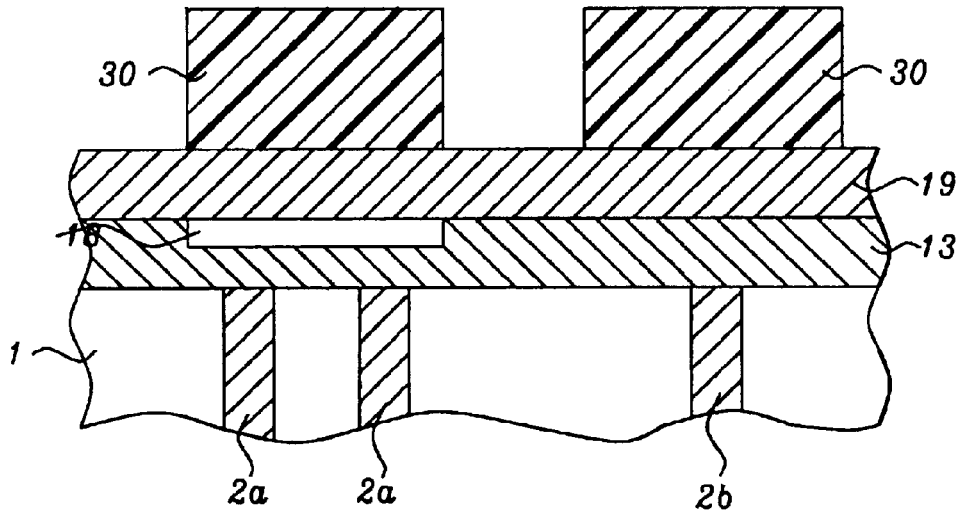
Figure 8:
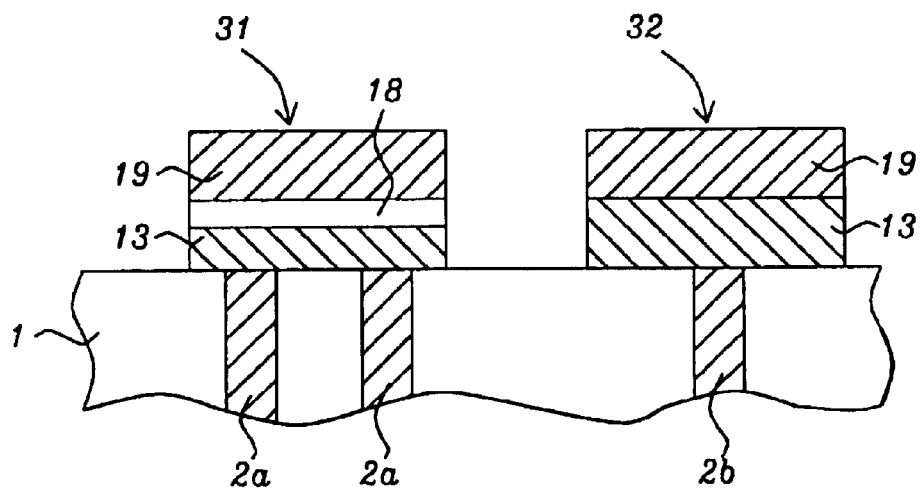

An overlying metal layer 19, comprised of either titanium, tantalum, aluminum, or copper, is next deposited, via PVD procedures, to a thickness between about 2500 to 4500 Angstroms, overlying high K layer 18, and metal layer 13. Photoresist shapes 30, shown schematically in FIG. 7, are then formed on the regions of metal layer 19, for purposes of defining the metal-oxide-metal, capacitor structure, as well as defining a metal interconnect structure. Anisotropic RIE procedures, using $Cl_2$ or $SF_6$ as an etchant for metal layer 19, and for metal layer 13, and using either $BF_3$, or $CF_4/CHF_3$ as an etchant for high K layer 18, are used to create capacitor structure 31, comprised of metal layer 19, high K layer 18, and metal layer 13, overlying, and contacting metal plug structures 2a. This is schematically shown in FIG. 8. The same RIE procedure results in the definition of metal interconnect structure 32, comprised of metal layer 19, and metal layer 13, communicating with active device regions, such as underlying metal interconnect structures, (not shown in the drawings), via metal plug structure 2b. After definition of these structures, photoresist shapes 30, are removed via plasma oxygen ashing and careful wet cleans. If desired underlying metal layer 13, as well as overlying metal layer 19, can be comprised of titanium, with a titanium nitride barrier layer, underlying metal layer 13, and with another titanium nitride barrier layer, located overlying metal layer 19.

While this invention has been particularly shown and described with reference to the preferred embodiments thereof, it will be understood by those skilled in the art that various changes in form and details may be made without departing from the spirit or scope of the invention.

What is claimed is:

1. A method of fabricating a high dielectric constant, (high K), layer, for a metal-oxide-metal capacitor structure, via exposure of a region of an underlying metal layer, to a UV, or to an I line procedure, performed in an oxidizing ambient, comprising the steps of:

depositing said underlying metal layer;

providing a quartz phtolithographic plate with a chromium pattern;

performing said UV, or I line exposure, in said oxidizing ambient created by a flow of 10 to to 1000 sccm of an oxidizing species, to a region of said underlying metal layer exposed through a clear opening in said quartz photolithographic plate, with said UV or I line procedure creating a temperature between about 250 to 100° C., at exposed portions of a top surface of said underlaying metal layer, creating said high K layer, in exposed top portion of said underlying metal layer;

depositing an overlying metal layer on said high K layer; and patterning of said overlying metal layer, of said high K layer, and of unoxidized, bottom portion of said underlying metal layer, forming said metal-oxide-metal, capacitor structure.

2. The method of claim 1, wherein said underlying metal layer is chosen from a group that includes, titanium, tantalum, aluminum, or copper, obtained via plasma vapor deposition, at a thickness between about 3000 to 5000 Angstroms.

3. The method of claim 1, wherein said UV, or said I line procedure, is performed at an energy between about 1 to 100 millijoules.

4. The method of claim 1, wherein said oxidizing ambient is chosen from a group that includes, $O_2$, $O_3$, NO, or $N_2O$.

5. The method of claim 1, wherein said high K layer is a metal oxide layer, chosen from a group that includes, $TiO_2$, $Ta_2O_5$, $Al_2O_3$, or $CuO_2$, at a thickness between about 100 to 400 Angstroms.

6. The method of claim 1, wherein said high K layer has a dielectric constant between about 22 to 35.

7. The method of claim 1, wherein said overlying metal layer is chosen from a group that includes aluminum, tantalum, titanium, or copper, obtained via plasma vapor deposition procedures, at a thickness between about 2500 to 4500 Angstroms.

8. The method of claim 1, wherein said metal-oxide-metal, capacitor structure is patterned via an anisotropic RIE procedure, using $Cl_2$ or $SF_6$, as an etchant for said overlying metal layer, and for said underlying metal layer, while either $BF_3$, or $CF_4/CHF_3$ is used as an etchant for said high K layer.

* * * * *